United States Patent [19]

Payne et al.

[11] Patent Number: 5,075,632
[45] Date of Patent: Dec. 24, 1991

[54] AUTOMATIC CONTROL USING PROXIMITY SENSORS

[75] Inventors: Reginald K. Payne, Maidenhead; Terence C. Platt, Bracknell, both of England

[73] Assignee: Memco-Med Limited, Berkshire, England

[21] Appl. No.: 430,931

[22] PCT Filed: Oct. 14, 1985

[86] PCT No.: PCT/GB85/00461
§ 371 Date: Aug. 15, 1986
§ 102(e) Date: Aug. 15, 1986

[87] PCT Pub. No.: WO86/02506
PCT Pub. Date: Apr. 24, 1986

Related U.S. Application Data

[63] Continuation of Ser. No. 887,113, Jun. 13, 1986, abandoned.

[30] Foreign Application Priority Data

Oct. 15, 1984 [GB] United Kingdom ................ 8426010

[51] Int. Cl.$^5$ ...................... G01N 27/00; G08B 13/16
[52] U.S. Cl. ......................................... 328/5; 307/356; 307/350; 307/308
[58] Field of Search ............... 307/308, 350, 351, 355, 307/356, 360, 361; 328/5, 176, 209

[56] References Cited

U.S. PATENT DOCUMENTS

| | | | |
|---|---|---|---|
| 4,004,234 | 1/1977 | Juvinall | 307/308 |
| 4,191,894 | 3/1980 | Noda et al. | 307/130 |
| 4,191,894 | 3/1980 | Noda et al. | 328/5 |
| 4,208,695 | 6/1980 | Noda et al. | 307/116 |
| 4,326,197 | 4/1982 | Evin | 340/561 |
| 4,538,153 | 8/1985 | Taga | 343/700 MS |

FOREIGN PATENT DOCUMENTS

| | | |
|---|---|---|
| 3044789 | 7/1982 | Fed. Rep. of Germany . |
| 2057691A | 4/1981 | United Kingdom . |
| 8202536 | 8/1982 | World Int. Prop. O. . |

Primary Examiner—Timothy P. Callahan
Attorney, Agent, or Firm—Cushman, Darby & Cushman

[57] ABSTRACT

Proximity sensor apparatus has at least first and second antenna strips arranged along the edge of a structure. The antenna strips receive signals reflected by an object whose proximity is to be detected. Signal processing circuitry is coupled to the antenna strips for receiving and processing the signals picked up by the antenna strips. Proximity detection may occur when the difference in signal strength received by the two antenna strips exceeds a threshold level. In one embodiment, the difference between the maximum and minimum signals is determined and increases the threshold as the difference between signals decreases. In another embodiment, the difference in signal strength is used to determine the position of the object on one side or another of the antenna strips. In yet another embodiment, a bootstrap electrode is positioned behind a single antenna strip and is electrically connected to follow the voltage induced on the antenna strip by the received signal.

6 Claims, 3 Drawing Sheets

AUTOMATIC CONTROL USING PROXIMITY SENSORS

This is a continuation of application Ser. No. 06/887,113, filed June 13, 1986, which was abandoned upon the filing hereof.

BACKGROUND OF THE INVENTION

This invention relates to automatic control using proximity sensors, e.g. for controlling doors and the like. Its principal application is in the control of lift doors, though it may be used in various analogous applications, e.g. machine safety guards, vehicle reversing aids and the like.

For many years lift doors have been controlled by electromechanical apparatus. There has been a very substantial amount of effort directed to door control while nevertheless avoiding inconvenience to users of the lift. Many such systems rely on proximity sensors to detect the presence of a person or object which obstructs the door or would obstruct it. The problem with many such systems is that they work electronically and find difficulty in distinguishing between people and, for example, metal parts of the lift shaft construction.

PCT Patent Application No: PCT/GB 82/00022, Publication No: WO 82/02536, discloses proximity detector circuitry suitable for use in connection with lift doors. The systems described therein (and described in several of the Patent Specifications cited in the search report forming part of the publication) do represent workable systems. However, they suffer from a number of disadvantages, in particular, the necessity of fairly careful installation and balancing procedures, which are not always easy to effect on site, and additionally they tend to require in any practical application association with one or more microswitches which operate as the door moves. Mechanical components such as microswitches are costly to install and adjust.

We have now found that by using a somewhat different alternative approach, and using circuitry which can easily be constructed compactly and robustly, it is possible to produce improved lift door control circuits which will both detect the presence of a person or object obstructing the door or about to do so and act to interrupt or prevent a door closing operation and, further, which can detect the presence of a person or object adjacent the door and initiate a door opening operation.

One problem with many standard systems concerns the design of sensor antennae which are designed to extend along the edge of a door or edges of a pair of doors, that edge or edges being the leading edge(s) when the doors are closing. There are two separate problems which arise: First it is desirable that the antenna "looks" asymmetrically relative to the door. It is important to be able to detect people coming up to a lift door from outside in order to be able to abort a closing operation and reopen the doors, but it is equally important not to prevent closing because of the close proximity of people already safely inside the lift. In the past, asymmetric deep guard channels have been used partially to surround the antenna and give an asymmetric field of sensitivity. These take up space and are tricky to install and adjust.

A second problem is that the sensitivity of the signal picked up by the antenna is effectively heavily diluted by the capacitance between antenna and guard. This capacitance which can be quite high e.g. of the order of 100 picofarad, needs to be compared with the alteration in capacitance between antenna and ground when a body e.g. a person approaches the antenna. The change may be several orders of magnitude less, thus giving very small changes of potential on the antenna itself. The input signal to whatever subsequent circuitry is used is effectively severely attenuated.

SUMMARY OF THE INVENTION

According to a first feature of the present invention there is provided proximity sensor apparatus including one or more antennae and circuitry associated with the or each antenna and designed to feed and detect a high frequency signal picked up by the antenna(e), the antenna(e) having associated with it, and located between it and ground, a further electrode, the further electrode being electrically connected to follow the voltage induced on the antenna(e).

Such an arrangement, conveniently called for reasons which will appear below, a bootstrap electrode, serves to mask the antenna from the normal grounded guard and accordingly to remove the capacitance dilution effect noted above. Preferably the antenna electrode and bootstrap electrode are connected together via an emitter follower.

Preferably the antenna is a strip of conductive material on one side of a printed circuit board and the bootstrap electrode is a strip of conductive material, conveniently somewhat broader than the antenna strip, on the other side of the printed circuit board.

The antenna output may be taken from the emitter of the transistor via a simple screened lead to appropriate processing circuitry. Using the printed circuit board technique of construction just noted, it is possible to construct very thin assemblies of antenna and bootstrap electrode which are ideally suited for installation along the leading edge of a door and which take up very little space.

Appropriate driver circuitry may be provided to inject e.g. a 50 kHz signal to ground, this signal then appearing on e.g. a person approaching the antenna so that it can be picked up by the antenna and processed using suitable circuitry. The International Patent Publication mentioned above gives details of such circuitry.

If desired, sensitivity may be increased by detecting signals from the antenna only corresponding to the frequency of the signal applied to ground. This can serve to eliminate false signals due to interference e.g. from electromechanical components such as motors and relays which may be associated with the apparatus the proximity detector is designed to control. A balanced synchronous detector system of known type may be used.

In particularly hostile environments, interference rejection may be substantially improved by using a modulated high frequency signal applied to ground and detected via the antenna, e.g. a 50 kHz signal modulated at 1 kHz.

The improved antenna structure described above is not particularly directional. Asymmetric detection may be achieved by providing a pair of (or more than two) parallel antennae strips, each preferably provided with its own bootstrap electrode as noted above, and each being associated with appropriate comparator circuitry in order to enable signal processing to be carried out with a comparison of the signals received by the two antennae. Since for many angles of approach to the antennae, one antenna will be closer to e.g. an approaching body than the other, the signal on that antenna will be correspondingly greater. By subtracting the signal or a signal derived therefrom in respect of one antenna from the corresponding signal or derived signal from the other, a positive or negative signal may be produced which will give an indication of which side something is approaching from. This can be easily adapted to render detection circuitry sensitive to movement outside of a lift shaft but not inside it.

According to yet a further feature of the present invention, an antenna proximity detection system of the type indicated above is combined with an optical sensor system, e.g. one using infrared emitting diodes and standard detection circuits to give an interaction, in accordance with appropriate preset logic, between proximity detection from an antenna type detector circuit and detection arising from the interruption of an infrared light beam. Such an approach is of particular value in connection with door control where metal objects are to be regularly taken past the door. For example lifts in hospitals and industrial sites often have metal trolleys, beds or the like wheeled in and out of them. Interruption of such a beam may be arranged to desensitise the antenna based system, which would then immediately be resensitised when the beam was re-established.

BRIEF DESCRIPTION OF THE DRAWINGS

Further features and advantages of the present invention will become apparent from the following description of a lift door proximity detection system, which is taken in conjunction with the accompanying drawings. In these drawings.

DETAILED DESCRIPTION OF THE PREFERRED EMBODIMENT

Figure 1:
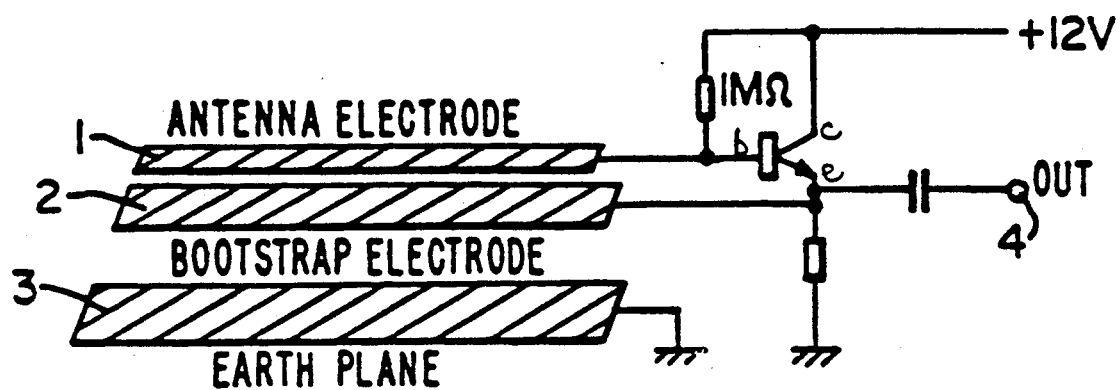
FIG. 1 is a diagrammatic representation of an antenna, bootstrap antenna and transistor stage arrangement.

Referring to the drawings FIG. 1 shows diagrammatically an antenna arrangement and its immediately associated circuitry. The actual antenna is constituted by a flat plate electrode 1 which may conveniently be a strip of copper foil on one side of a piece of printed circuit board. On the other side of the circuit board a similarly shaped but slightly larger piece of copper foil constitutes a so-called bootstrap electrode 2. The piece of printed circuit board on which electrodes 1 and 2 are found is mounted in a flat metal channel which constitutes an earth plane 3, the channel being mounted along e.g. the leading edge of a lift door with the antenna electrode 1 facing away from the door.

Electrodes 1 and 2 are directly connected to the base and emitter respectively of a single transistor stage consisting of the transistor itself, two biasing resistors as shown and a capacitor. Any AC signal received by the electrode will be transferred via the bootstrap emitter follower to the bootstrap electrode 2, the signal on the latter being passed also to the capacitor via which an AC output signal may be extracted at 4.

Figure 2:
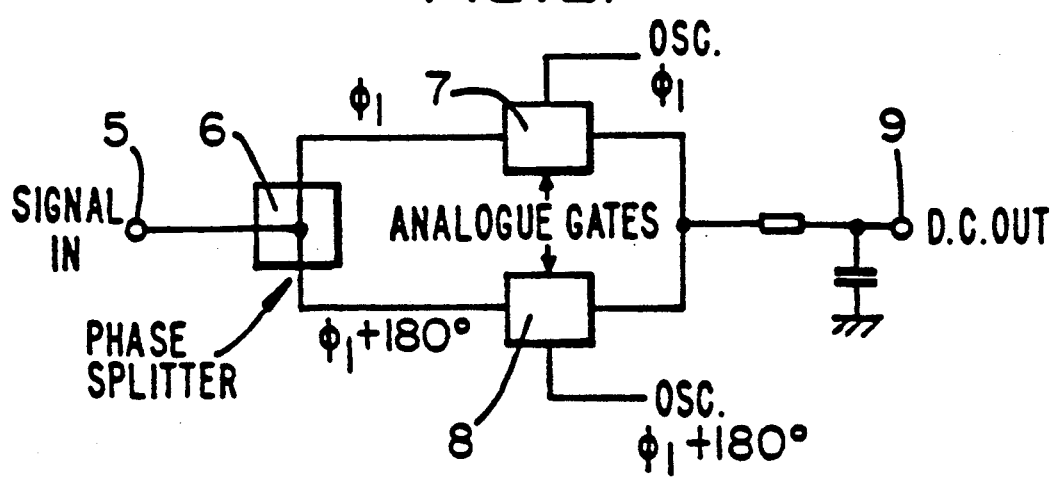
FIG. 2 is a block diagram of a synchronous detector system.

This signal may be fed to the input 5 of the synchronous detector shown diagrammatically in FIG. 2. The signal is passed to a phase splitter 6 and the resulting two signals, 180° apart, passed to analogue gates 7 and 8, which gates are fed with respective signals 180° out of phase from a suitable master oscillator which originated the original signal picked up by the antenna 1. The outputs of the analogue gates are fed via a simple resistor capacitor network to an output terminal 9.

Figure 3:
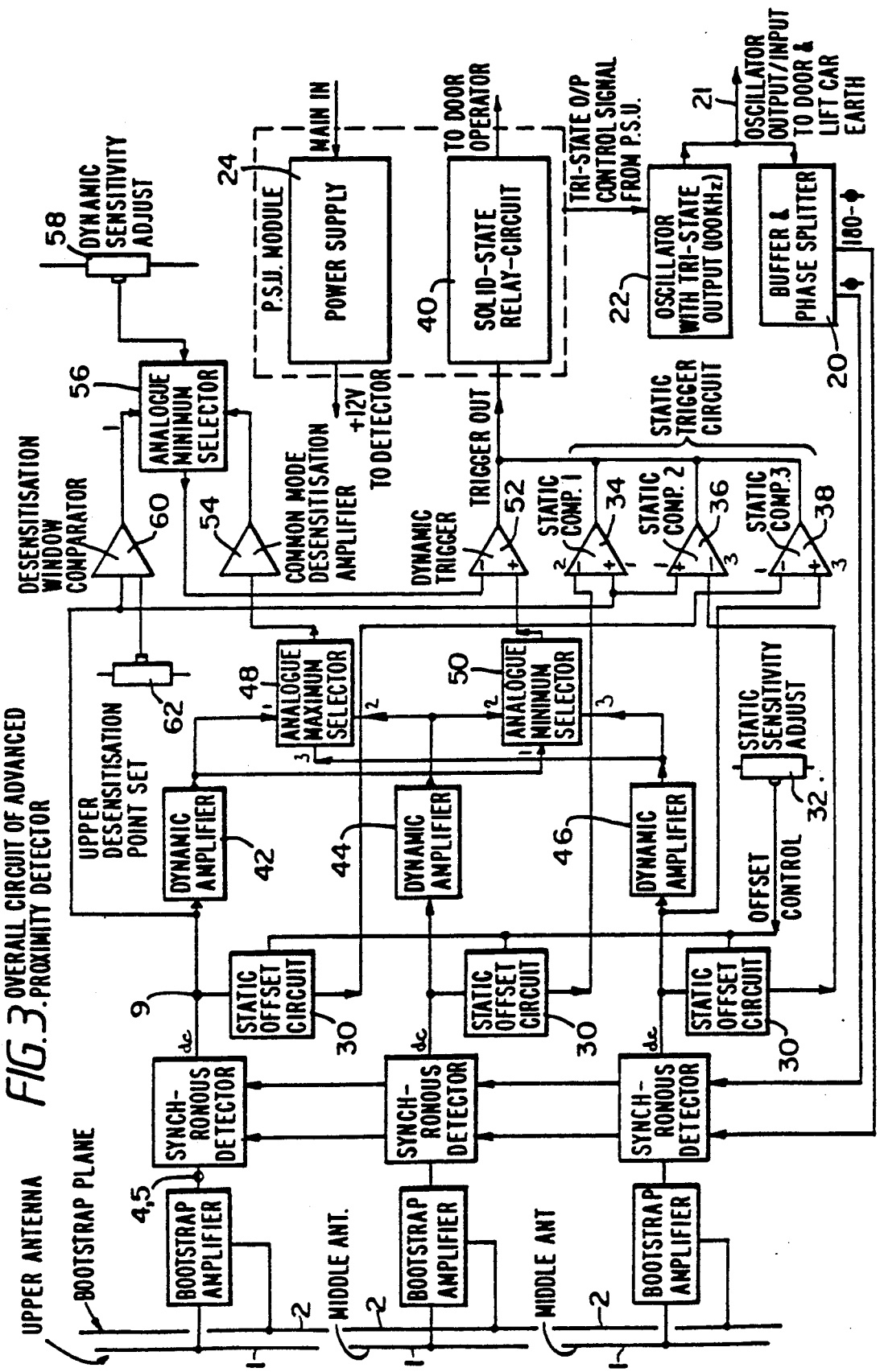
FIG. 3 is a block diagram showing the overall circuitry of a working lift door control system.

FIG. 3 shows the full block diagram circuit of a lift door control system. At the left of the Figure can be seen pairs of antenna and bootstrap electrodes 1, 2, and at the right of the Figure, a power supply 24, relay circuit 40 and oscillator 22.

The output of the 50-100 KHz oscillator within the unit 22 is connected via a flying lead 21 to the metalwork of a door assembly which carries all the detector circuitry, so that a 12 v.p-p squarewave signal appears between the detector circuit assembly and external ground, i.e. any persons or conductive objects adjacent to the door.

This signal is received at the antennae 1 via stray capacitance between the antennae and earth such that under normal circumstances (no obstruction close to the door) a fairly small and equal oscillator voltage is induced at all three bootstrap amplifier inputs. The bootstrap electrode 2 behind each antenna 1 greatly increases the voltage received at the antennae by minimising the stray capacitance to detector ground. The received A.C. signal is thus fed to each of 3 synchronous detectors which are driven by oscillator 22 via a buffer and phase splitter 20, and which thus rectify the signal inputs to D.C. outputs proportional to the antenna voltages. Being synchronous with the input signal these circuits have an excellent interference rejection performance and greatly reduce the likelihood of a spurious trigger due to interference from contactors etc.

The D.C. signals are amplified by the detector circuits and at this point are of the order of one volt due to the static signal from the surroundings of the device combined with about 10–100 mV fluctuations induced by the close proximity of persons entering the doorway.

It is now necessary to divide the signal path in such a way that a static or 'courtesy hold' trigger can be generated separately from the 'dynamic' long range trigger signal. To this end, a ganged set of 3 offset circuits 30 produces output signals which are D.C. offset by an adjustable amount from the direct signal. The D.C. offset forms a threshold which is used to determine whether one of the antennas is giving considerably more signal than the others by comparing the direct and offset signals in three comparators 34, 36 and 38. Any difference greater than the offset voltage will cause an output trigger and will be permanent as long as the detector is close to the person or object inducing the signal.

To derive a long range dynamic sensitivity, i.e. one which can reverse the door before contact with an obstruction but which is generated by an object moving with respect to the detector, further A.C. amplification is required. This is provided by three dynamic amplifiers 42, 44 and 46, which have a time constant of approximately 0.5 seconds and a voltage gain of about 100 times.

A very small change of input is thus sufficient to cause a large but short lived negative going output swing into two combiner/selector circuits 48 and 50. Combiner/selector 48 is used to determine the most positive output of the three dynamic amplifiers whilst combiner/selector 50 selects the most negative output present.

To achieve a dynamic trigger, the output of combiner/selector 50 must fall below the voltage on the negative going input of comparator 52 which is derived from a sensitivity determining circuit consisting of components 54, 56, 58, 60 and 62 as shown.

This circuit can discriminate between an obstruction in the doorway and the approach of the door to e.g. a door frame or other symmetrical metalwork and thus reduce the detector sensitivity when the door is approaching signal inducing metalwork which is part of the door structure. The principle used is to combine the output of a dynamic sensitivity control 58, which sets the maximum sensitivity, with the output of a comparator 60 which is fed with the overall static signal from the upper antenna and the amplified output of the maximum selector 48. Whichever of these gives the lowest output voltage determines the threshold for comparator 52 and hence the dynamic sensitivity of the unit. As the detector approaches a door frame etc., roughly equal signals are induced in all three antennas and the 'maximum' output is close to the 'minimum' output. This causes the output of amplifier 54 to pull down the threshold on comparator 52 negative input at a greater speed than the output of 50 is falling and a trigger will not occur. In addition, if a very large static output from the upper antenna is present the comparator 60 will change state and switch off the dynamic sensitivity completely so that a fully open or closed door will only be 'static' sensitive. Vibration of the door near the frame etc. is thus unlikely to cause spurious triggers.

When a person is present in the doorway the moving detector (moving on the leading edge of the moving door) will have much greater signals on one antenna compared to the others, due to the irregular outline of the body which is approaching it and this causes the difference between the maximum and minimum selector outputs to be much greater. The threshold on comparator 52 thus remains close to that derived from 58 alone and a trigger is readily achieved to reverse the door movement.

Figure 4:
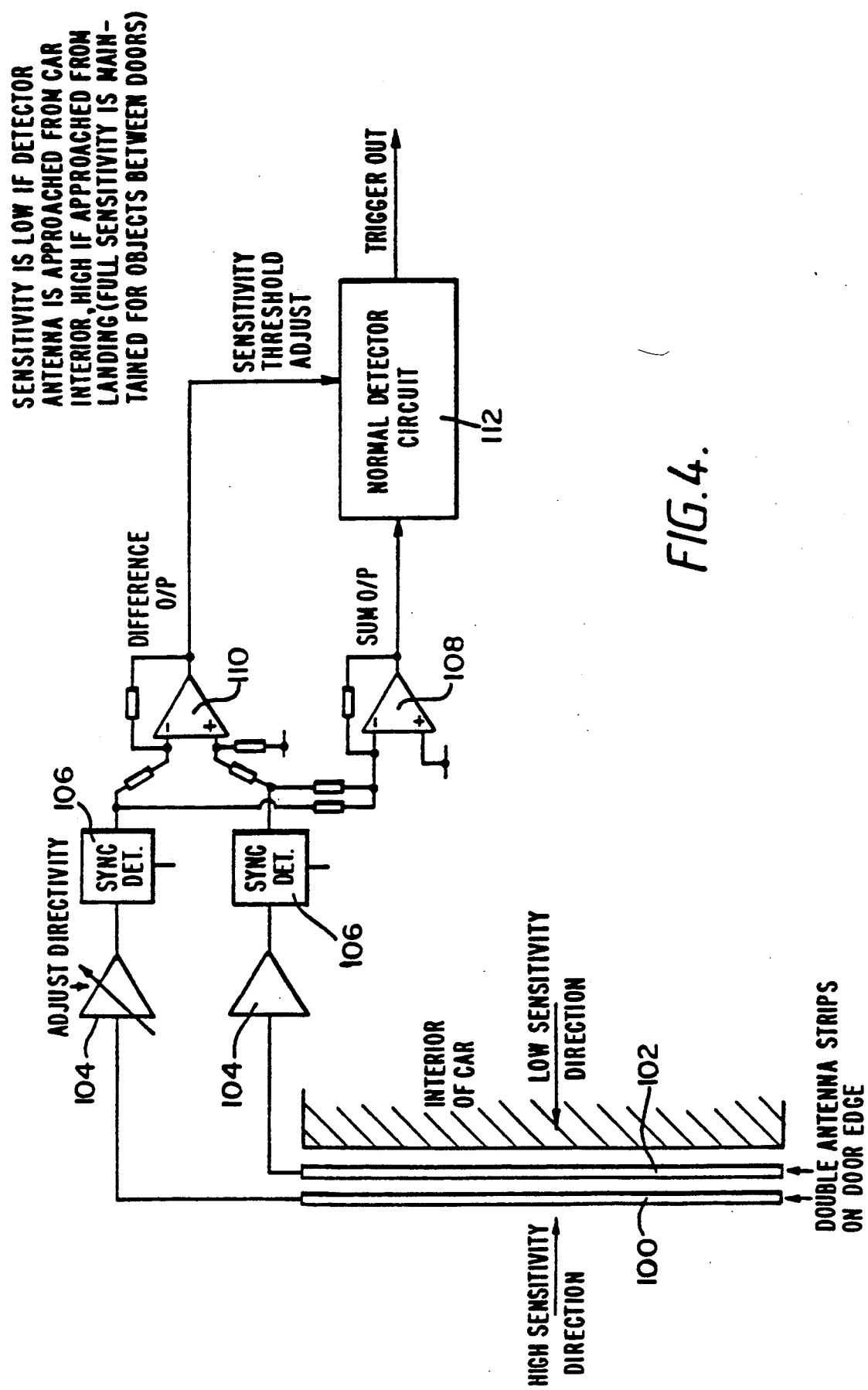
FIG. 4 is a diagrammatic illustration of a split antenna with appropriate circuitry to provide asymmetric sensitivity.

FIG. 4 shows how directional sensitivity may be achieved by the use of two parallel antennas within a channel at the edge of a door by carrying out a differential comparison of the output signals from the two antennae. In such an arrangement, the antenna closer to a moving object will provide the greater output and thus the direction of approach can be determined from the polarity of the differential between the signals from the two antennae. It is thus possible to cause a trigger to occur for an object approaching from outside a lift car but to ignore movement by persons already within the car. This directional sensitivity may be rotated in azimuth by varying the relative gain of the antenna amplifiers. In the practical application shown in FIG. 4, two antenna strips 100, 102, each approximately 6 mm wide are located about 25 mm apart on a single printed circuit board. Associated with each antenna is a bootstrap electrode as described above. The antennae are connected via amplifiers 104 and synchronous detectors 106 to a pair of differential amplifiers 108, 110, which respectively derive a direct sum output and a differential output of adjustable gain and polarity for steering purposes. The sum output is used to drive a normal detector circuit 112 to trigger door opening if a signal above a certain threshold is present with any angle of approach, whilst the differential signal inhibits the detector circuit trigger when the person generating the signal is in the sector within the car from which it is not desired to generate a door opening signal.

We claim:
1. Promixity sensor apparatus comprising:
   a plurality of antennae, receiving a plurality of signals; and
   processing means operable for receiving and processing said plurality of signals picked up by respective ones of the antennae and for generating an output response in relation to the signals received, the processing means including:
   (a) first selection means for selecting a maximum signal from among the plurality of signals received,
   (b) second selection means for selecting a minimum signal from among the plurality of signals received,
   (c) threshold selection means for automatically selecting a threshold level having a smallest value from a plurality of threshold levels, where each threshold level corresponds to a condition for which an output signal may be generated, one of the threshold levels being derived from a selected maximum threshold signal and the threshold selection means being operable to select said minimum threshold level from said plurality of threshold levels including a threshold corresponding to the selected maximum signal and other threshold levels, one or more of the other threshold levels being adjustable to a fixed level, and
   (d) comparison means for comparing the selected minimum signal with the selected threshold level and for generating an output signal when the selected minimum signal exceeds the selected threshold level, one of the threshold levels being derived from a selected maximum threshold signal and the threshold selection means being operable to select a minimum threshold level from a threshold corresponding to the selected maximum signal and other threshold levels, one or more of the other threshold levels being adjustable to a fixed level.

2. Apparatus according to claim 1, wherein each antenna includes an electrode associated with said each antenna, the electrode being located between said each antenna and ground, and potential following means connected to said electrode to follow the voltage induced on the antenna.

3. Apparatus according to claim 2, wherein said each antenna and the electrode are connected together via an emitter follower.

4. Apparatus according to claim 2, wherein said each antenna comprises a strip of conductive material formed on one side of a printed circuit board, the electrode comprising another strip of conductive material formed on the other side of the printed circuit board.

5. Apparatus according to claim 1, wherein at least one antenna comprises a pair of parallel antenna strips, each strip being connected to further processing means which includes means for detecting signals received by each antenna strip, means for determining which antenna strip is receives the greater signal, means for subtracting a signal or a signal derived therefrom in respect of one antenna strip from a corresponding signal or a signal derived therefrom in respect of the other antenna strip to produce an inhibit signal, means for summing the signals received by the two antenna strips to produce said output response, the inhibit signal being indicative of the position of an object relative to the pair of antenna strips and being used to prevent the output response being produced when a predetermined one of the antenna strips receives the greater signal.

6. Apparatus according to claim 1 further including an optical sensor system comprising an infrared light source which directs a beam to a detector, and means for inhibiting the processing means if the beam is interrupted.

* * * * *